US010361092B1

(12) United States Patent
Roberts et al.

(10) Patent No.: US 10,361,092 B1
(45) Date of Patent: Jul. 23, 2019

(54) ETCHING FEATURES USING METAL PASSIVATION

(71) Applicant: Lam Research Corporation, Fremont, CA (US)

(72) Inventors: Francis Sloan Roberts, Redwood City, CA (US); Eric Hudson, Berkeley, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/903,865

(22) Filed: Feb. 23, 2018

(51) Int. Cl.
*H01L 21/311* (2006.01)
*H01L 27/105* (2006.01)
*H01L 21/8239* (2006.01)

(52) U.S. Cl.
CPC .. *H01L 21/31116* (2013.01); *H01L 21/31144* (2013.01); *H01L 21/8239* (2013.01); *H01L 27/1052* (2013.01)

(58) Field of Classification Search
CPC ........ H01J 37/3435; B33Y 10/00; C23F 1/20; B23K 26/342; C23C 14/3414; H01L 21/31116; H01L 27/1052; H01L 21/31144; H01L 21/8239
USPC ....... 438/706, 710, 712, 714, 720, 736, 780; 156/345.37, 345.53
See application file for complete search history.

(56) References Cited

U.S. PATENT DOCUMENTS

| | | | |
|---|---|---|---|
| 3,704,511 A | 12/1972 | Hooker | |
| 3,899,711 A | 8/1975 | Lemmond | |
| 4,200,794 A | 4/1980 | Newberry et al. | |
| 4,419,580 A | 12/1983 | Walker et al. | |
| 4,873,445 A | 10/1989 | Le Jeune | |
| 4,894,696 A | 1/1990 | Takeda | |
| 5,284,544 A | 2/1994 | Mizutani et al. | |
| 5,767,018 A | 6/1998 | Bell | |
| 5,948,704 A | 9/1999 | Benjamin et al. | |
| 6,176,667 B1 | 1/2001 | Fairbairn et al. | |
| 6,547,977 B1 | 4/2003 | Yan | |
| 6,617,595 B1 | 9/2003 | Okunuki | |
| 6,841,943 B2 | 1/2005 | Vahedi et al. | |
| 7,037,846 B2 | 5/2006 | Srivastava et al. | |
| 7,105,390 B2 | 9/2006 | Brask et al. | |
| 7,416,989 B1 | 8/2008 | Liu et al. | |

(Continued)

FOREIGN PATENT DOCUMENTS

| | | |
|---|---|---|
| CA | 1157511 | 11/1983 |
| CA | 1184239 | 3/1985 |

(Continued)

OTHER PUBLICATIONS

Belau et al. "Method for Etching Features in a Stack" U.S. Appl. No. 15/798,831, filed Oct. 31, 2017.

(Continued)

*Primary Examiner* — Lan Vinh
(74) *Attorney, Agent, or Firm* — Beyer Law Group LLP

(57) ABSTRACT

A method for etching features in a stack below a patterned mask in an etch chamber is provided. The stack is cooled with a coolant, with a coolant temperature below −20° C. An etch gas comprising a metal containing component, a carbon containing component, and a halogen containing component is flowed into the etch chamber. A plasma is generated from the etch gas. Features are selectively etched in the stack with respect to the patterned mask.

19 Claims, 6 Drawing Sheets

(56) References Cited

U.S. PATENT DOCUMENTS

| | | | |
|---|---|---|---|
| 7,732,728 B2 | 6/2010 | Dhindsa et al. | |
| 7,740,736 B2 | 6/2010 | Fischer et al. | |
| 7,951,683 B1 | 5/2011 | Shanker | |
| 7,977,249 B1 | 7/2011 | Liu et al. | |
| 7,977,390 B2 | 7/2011 | Ji et al. | |
| 7,981,763 B1 | 7/2011 | van Schravendijk et al. | |
| 8,058,179 B1 | 11/2011 | Draeger et al. | |
| 8,187,486 B1 | 5/2012 | Liu et al. | |
| 8,552,334 B2 | 10/2013 | Tappan et al. | |
| 8,608,973 B1 | 12/2013 | Guha | |
| 8,617,411 B2 | 12/2013 | Singh | |
| 8,658,511 B1* | 2/2014 | Fulgenico | H01L 21/31122 438/238 |
| 9,378,971 B1 | 6/2016 | Briggs et al. | |
| 9,384,998 B2 | 7/2016 | Hudson et al. | |
| 9,406,535 B2 | 8/2016 | Berry, III et al. | |
| 9,536,748 B2 | 1/2017 | Berry, III et al. | |
| 9,543,148 B1 | 1/2017 | Hudson et al. | |
| 9,543,158 B2 | 1/2017 | Hudson et al. | |
| 9,548,188 B2 | 1/2017 | Hausmann | |
| 9,620,377 B2 | 4/2017 | Hudson et al. | |
| 9,887,097 B2 | 2/2018 | Hudson | |
| 9,997,372 B2 | 6/2018 | Briggs et al. | |
| 9,997,373 B2 | 6/2018 | Hudson | |
| 2003/0003755 A1 | 1/2003 | Donohoe | |
| 2003/0168588 A1 | 9/2003 | Brailove et al. | |
| 2004/0084410 A1 | 5/2004 | Lenz | |
| 2005/0136682 A1 | 6/2005 | Hudson et al. | |
| 2005/0199822 A1 | 9/2005 | Saini et al. | |
| 2005/0211926 A1 | 9/2005 | Ito et al. | |
| 2006/0121721 A1 | 6/2006 | Lee et al. | |
| 2006/0192104 A1 | 8/2006 | Schultz et al. | |
| 2006/0226120 A1 | 10/2006 | Rusu | |
| 2007/0026677 A1 | 2/2007 | Ji et al. | |
| 2007/0049018 A1 | 3/2007 | Sandhu | |
| 2007/0063337 A1 | 3/2007 | Schubert et al. | |
| 2007/0068624 A1 | 3/2007 | Jeon et al. | |
| 2007/0181820 A1 | 8/2007 | Hwang et al. | |
| 2008/0132046 A1 | 6/2008 | Walther | |
| 2008/0179186 A1 | 7/2008 | Shimura et al. | |
| 2008/0286978 A1 | 11/2008 | Chen et al. | |
| 2009/0163035 A1 | 6/2009 | Romano et al. | |
| 2009/0203218 A1 | 8/2009 | Matsuyama | |
| 2009/0275202 A1 | 11/2009 | Tanaka et al. | |
| 2010/0009543 A1 | 1/2010 | Cho | |
| 2010/0173494 A1 | 7/2010 | Kobrin | |
| 2011/0100954 A1 | 5/2011 | Satake et al. | |
| 2011/0151670 A1 | 6/2011 | Lee et al. | |
| 2011/0201208 A1 | 8/2011 | Kawakami | |
| 2011/0207323 A1* | 8/2011 | Ditizio | B81C 1/00087 438/675 |
| 2012/0288799 A1 | 11/2012 | Takase et al. | |
| 2013/0137275 A1 | 5/2013 | Tong | |
| 2013/0157470 A1 | 6/2013 | Watanabe et al. | |
| 2013/0216959 A1 | 8/2013 | Tanaka et al. | |
| 2013/0316518 A1 | 11/2013 | Hollister et al. | |
| 2014/0021343 A1 | 1/2014 | Kirkpatrick et al. | |
| 2014/0038412 A1 | 2/2014 | Hu et al. | |
| 2014/0043216 A1 | 2/2014 | Tang | |
| 2014/0065838 A1 | 3/2014 | Ellinger et al. | |
| 2014/0076716 A1 | 3/2014 | Gorokhovsky et al. | |
| 2014/0220785 A1 | 8/2014 | Watanabe et al. | |
| 2014/0335679 A1* | 11/2014 | Liu | H01L 21/3065 438/466 |
| 2014/0356985 A1 | 12/2014 | Ricci et al. | |
| 2015/0050807 A1 | 2/2015 | Wu et al. | |
| 2015/0083582 A1 | 3/2015 | Dhindsa et al. | |
| 2015/0179393 A1 | 6/2015 | Colvin et al. | |
| 2015/0270140 A1* | 9/2015 | Gupta | H01L 21/32136 216/67 |
| 2015/0311292 A1 | 10/2015 | Srinivasan et al. | |
| 2015/0348792 A1* | 12/2015 | Lee | H01L 21/3065 438/714 |
| 2016/0049281 A1 | 2/2016 | Berry, III et al. | |
| 2016/0064232 A1 | 3/2016 | Berry, III et al. | |
| 2016/0064260 A1 | 3/2016 | Berry, III et al. | |
| 2016/0111294 A1 | 4/2016 | Berry, III et al. | |
| 2016/0163556 A1 | 6/2016 | Briggs et al. | |
| 2016/0163557 A1 | 6/2016 | Hudson et al. | |
| 2016/0163558 A1 | 6/2016 | Hudson et al. | |
| 2016/0163561 A1 | 6/2016 | Hudson et al. | |
| 2016/0181117 A1 | 6/2016 | Arghavani | |
| 2016/0218015 A1 | 7/2016 | Oomori | |
| 2016/0260617 A1 | 9/2016 | Hudson et al. | |
| 2016/0260620 A1 | 9/2016 | Briggs et al. | |
| 2016/0268141 A1 | 9/2016 | Hudson | |
| 2016/0307781 A1 | 10/2016 | Berry, III et al. | |
| 2016/0343580 A1 | 11/2016 | Hudson | |
| 2016/0351407 A1 | 12/2016 | Sawataishi | |
| 2016/0379856 A1 | 12/2016 | Tomura | |
| 2017/0062181 A1 | 3/2017 | Berry, III et al. | |
| 2017/0076945 A1 | 3/2017 | Hudson et al. | |
| 2017/0076955 A1 | 3/2017 | Hudson et al. | |
| 2017/0170026 A1 | 6/2017 | Hudson et al. | |
| 2017/0178920 A1 | 6/2017 | Dole et al. | |
| 2017/0229316 A1 | 8/2017 | Surla | |
| 2018/0286707 A1 | 10/2018 | Hudson et al. | |

FOREIGN PATENT DOCUMENTS

| | | |
|---|---|---|
| CN | 1661762 A | 8/2005 |
| JP | 06-208837 A | 7/1994 |
| KR | 10-2006-0030717 | 4/2006 |
| KR | 10-2011-0097193 A | 8/2011 |
| WO | 2013/012620 | 1/2013 |

OTHER PUBLICATIONS

Briggs et al. U.S. Appl. No. 15/069,022, filed May 10, 2017.

Notice of Allowance for Briggs et al. U.S. Appl. No. 15/069,022, filed May 10, 2017.

Office Action from U.S. Appl. No. 15/798,831 dated Oct. 10, 2018.

Hanson et al. (2003) "Bonding Self-Assembled, Compact Organophosphonate Monolayers to the Native Oxide Surface of Silicon," *J. Am. Chem. Soc.*,125(51):16074-16080.

Jung et al. (2005) "Vapor-Phase Self-Assembled Monolayer for Improved Mold Release in Nanoimprint Lithography," *Langmuir*, 21(4):1158-1161.

Yang et al. (2006) "CVD Growth Kinetics of $HfB_2$ Thin Films from the Single-Source Precursor $Hf(BH_4)_4$," *Chem. Mater.*, American Chemical Society, 18(21):5088-5096.

Yanguas-Gil et al. (Sep./Oct. 2009) "Highly conformal film growth by chemical vapor deposition. II. Conformality enhancement through growth inhibition," *Journal of Vacuum Science & Technology A*, 27(5):1244-1248.

Zhuang et al. (2006) "Thermal stability of vapor phase deposited self-assembled monolayers for MEMS anti-stiction," *J. Micromech. Microeng.*, 16:2259-2264.

Zhou, Han and Bent, Stacey F. (Jul./Aug. 2013) "Fabrication of organic interfacial layers by molecular layer deposition: Present status and future opportunities," *Journal of Vacuum Science Technology A*, American Vacuum Society, 31(4), 040801-1-040801-18.

Ohiwa, et al. (1992) "$SiO_2$ Tapered Etching Employing Magnetron Discharge of Fluorocarbon Gas," *Jpn. J. Appl. Phys.*, vol. 31, Part 1, No. 2A, pp. 405-410.

Ohiwa, et al. (1990) "$SiO_2$ Tapered Etching Employing Magnetron Discharge," *Dry Process Symposium*, V-3, pp. 105-109.

Engelhardt, et al. (1988) "Deep Trench Etching Using $CBrF_3$ and $CBrF_3$/Chlorine Gas Mixture," Siemens AG, Otto-Hahn-Ring, 8000 Munich 83, Germany, pp. 48-54.

Matsuo, S., "Selective Etching of Si Relative to $SiO_2$ Without Undercutting by CBrF3 Plasma," American Institute of Physics, Appl. Phys. Lett., 36(9), May 1, 1980, 4 pp.

S. Wolf and R.N. Tauber, "Silicon Processing for the VLSI Era" vol. 1, Process Technology, Lattice Press, 1986.

* cited by examiner

ETCHING FEATURES USING METAL PASSIVATION

BACKGROUND

The disclosure relates to a method of forming semiconductor devices on a semiconductor wafer. More specifically, the disclosure relates to etching a stack in the formation of memory.

In forming semiconductor devices, etch layers may be etched to form memory holes or lines. Some semiconductor devices may be formed by etching a stack of bilayers of silicon oxide (oxide) and silicon nitride (nitride) (ONON). Such stacks may be used in memory applications, such as in forming dynamic random access memory (DRAM) and three dimensional "negative and" gates (3D NAND). The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

To achieve the foregoing and in accordance with the purpose of the present disclosure, a method for etching features in a stack below a patterned mask in an etch chamber is provided. The stack is cooled with a coolant, with a coolant temperature below −20° C. An etch gas comprising a metal containing component, a carbon containing component, and a halogen containing component is flowed into the etch chamber. A plasma is generated from the etch gas. Features are selectively etched in the stack with respect to the patterned mask.

These and other features of the present disclosure will be described in more details below in the detailed description and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Figure 1:
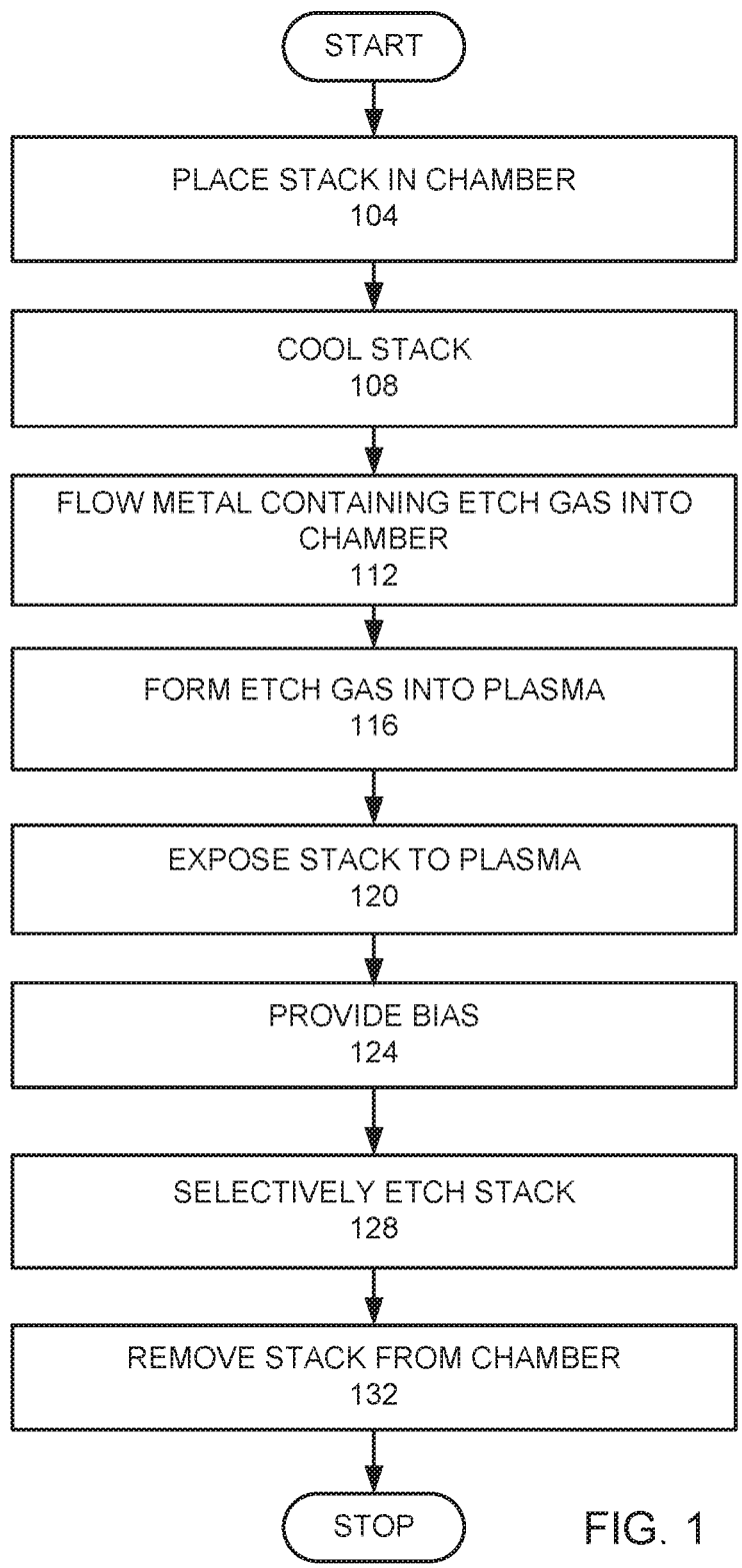
FIG. 1 is a high level flow chart of an embodiment.

FIG. 1 is a high level flow chart of an embodiment. In this embodiment, a stack is placed in an etch chamber (step 104). The stack is disposed below a patterned mask. The stack is cooled by a coolant with a coolant temperature below −20° C. (step 108). An etch gas is provided by flowing the etch gas into the etch chamber, wherein the etch gas comprises a metal containing component, a carbon containing component, and a halogen containing component (step 112). The etch gas is formed into an etch plasma (step 116). The stack is exposed to the plasma (step 120). A bias is provided with a magnitude of at least 400 volts to accelerate ions from the etch plasma to the stack (step 124). The stack is selectively etched with respect to the patterned mask by the etch plasma (step 128). The stack is removed from the etch chamber (step 132).

Example

Figure 2:
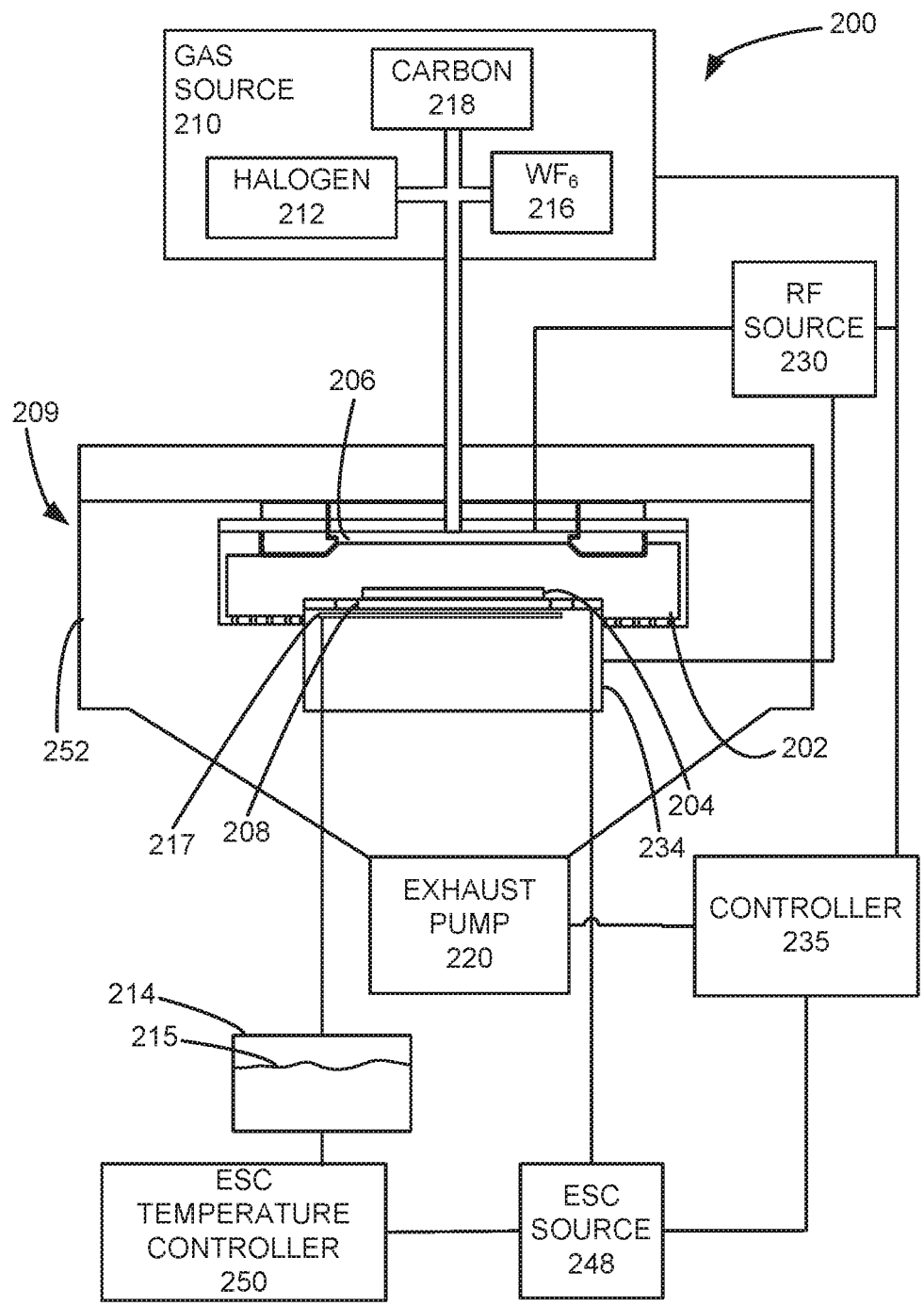
FIG. 2 is a schematic view of an etch chamber that may be used in an embodiment.

FIG. 2 is a schematic view of an etch reactor 200 that may be used in an embodiment. In one or more embodiments, an etch reactor 200 comprises a gas distribution plate 206 providing a gas inlet and an electrostatic chuck (ESC) 208, within an etch chamber 209, enclosed by a chamber wall 252. Within the etch chamber 209, a stack 204 is positioned over the ESC 208. The ESC 208 may provide a bias from the ESC source 248. An etch gas source 210 is connected to the etch chamber 209 through the gas distribution plate 206. In this example, the etch gas source 210 comprises a halogen containing component source 212, a tungsten hexafluoride ($WF_6$) source 216, and a carbon containing component source 218. An ESC temperature controller 250 is connected to a chiller 214, which chills a coolant 215. In this embodiment, the chiller 214 provides the coolant 215 to channels 217 in or near the ESC 208. A radio frequency (RF) source 230 provides RF power to a lower electrode and/or an upper electrode, which in this embodiment are the ESC 208 and the gas distribution plate 206, respectively. In an exemplary embodiment, 400 kilohertz (kHz), 60 megahertz (MHz), and optionally, 2 MHz, 27 MHz power sources make up the RF source 230 and the ESC source 248. In this embodiment, the upper electrode is grounded. In this embodiment, one generator is provided for each frequency. In other embodiments, the generators may be in separate RF sources, or separate RF generators may be connected to different electrodes. For example, the upper electrode may have inner and outer electrodes connected to different RF sources. Other arrangements of RF sources and electrodes may be used in other embodiments. A controller 235 is controllably connected to the RF source 230, the ESC source 248, an exhaust pump 220, and the etch gas source 210. An example of such an etch chamber is the Flex™ etch system manufactured by Lam Research Corporation of Fremont, CA. The process chamber can be a CCP (capacitive coupled plasma) reactor or an ICP (inductive coupled plasma) reactor.

Figure 3:
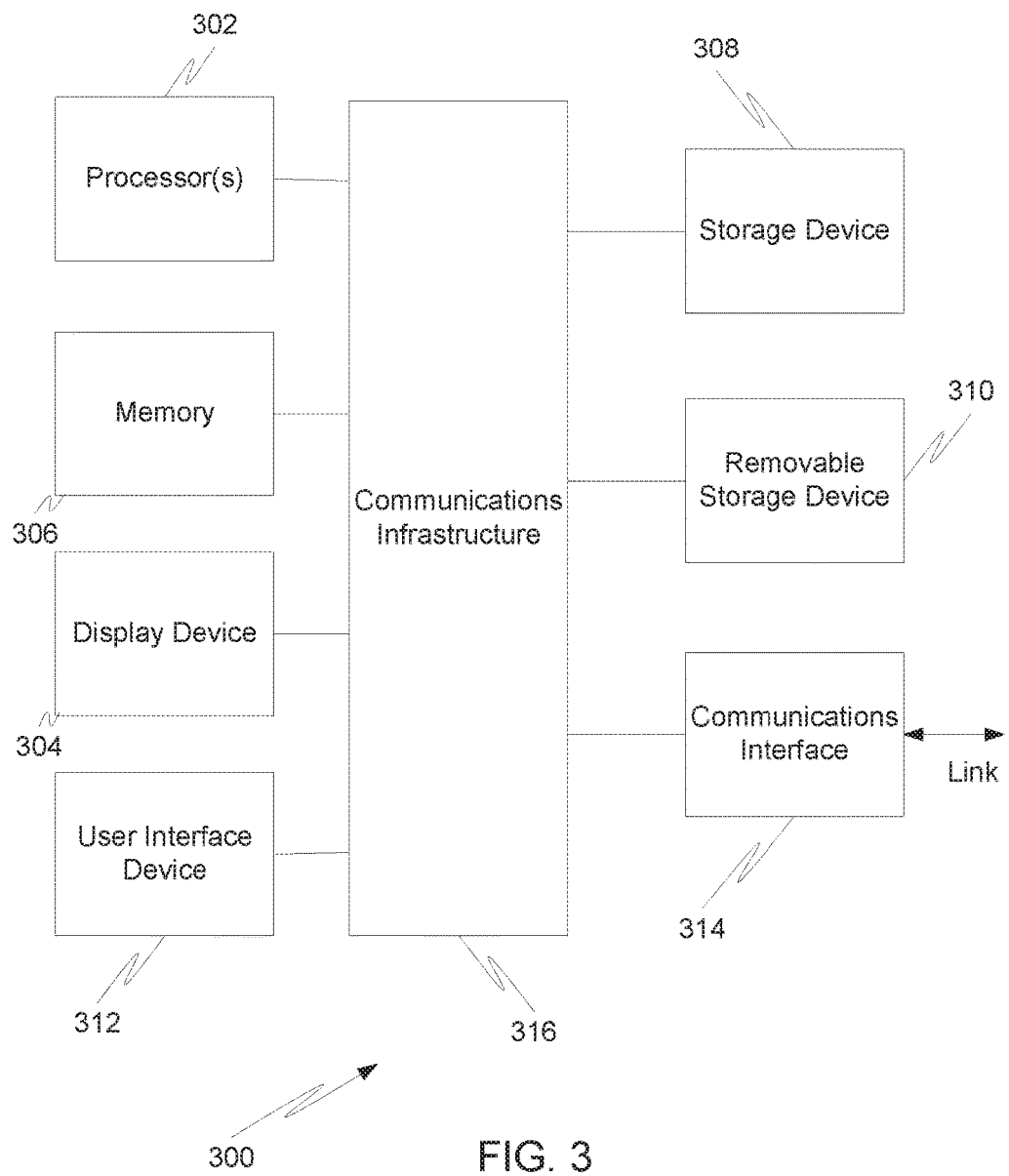
FIG. 3 is a schematic view of a computer system that may be used in practicing an embodiment.

FIG. 3 is a high level block diagram showing a computer system 300, which is suitable for implementing a controller 235 used in embodiments. The computer system 300 may have many physical forms ranging from an integrated circuit, a printed circuit board, and a small handheld device up to a huge super computer. The computer system 300 includes one or more processors 302, and further can include an electronic display device 304 (for displaying graphics, text, and other data), a main memory 306 (e.g., random access memory (RAM)), storage device 308 (e.g., hard disk drive), removable storage device 310 (e.g., optical disk drive), user interface devices 312 (e.g., keyboards, touch screens, keypads, mice or other pointing devices, etc.), and a communications interface 314 (e.g., wireless network interface). The communications interface 314 allows software and data to be transferred between the computer system 300 and external devices via a link. The system may also include a communications infrastructure 316 (e.g., a communications bus, cross-over bar, or network) to which the aforementioned devices/modules are connected.

Information transferred via communications interface 314 may be in the form of signals such as electronic, electromagnetic, optical, or other signals capable of being received by communications interface 314, via a communications link that carries signals and may be implemented using wire or cable, fiber optics, a phone line, a cellular phone link, a radio frequency link, and/or other communications channels. With such a communications interface 314, it is contemplated that the one or more processors 302 might receive information from a network, or might output information to the network in the course of performing the above-described method steps. Furthermore, method embodiments may execute solely upon the processors or may execute over a network such as the Internet, in conjunction with remote processors that share a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 4A:
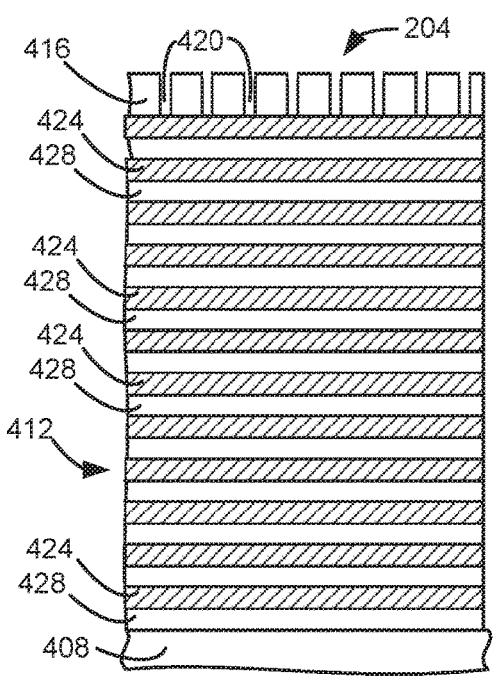
FIGS. 4A-B are schematic cross-sectional views of a stack processed according to an embodiment.

In an exemplary embodiment, a stack is placed in an etch chamber (step 104). FIG. 4A is a schematic cross-sectional view of a stack 204, which, in this embodiment, comprises a substrate 408 under a plurality of bilayers 412, which is disposed below a patterned mask 416. In this example, one or more layers may be disposed between the substrate 408 and the plurality of bilayers 412 or the plurality of bilayers 412 and the patterned mask 416. In this example, the patterned mask 416 is a carbon containing patterned mask, such as amorphous carbon. This embodiment does not have a silicon containing mask above the plurality of bilayers 412 or above the patterned mask 416. In this example, patterned mask pattern provides mask features 420 for high aspect ratio contacts. In some embodiments, the mask features 420 are formed before the stack 204 is placed in the etch chamber 209. In other embodiments, the mask features 420 are formed while the stack 204 is in the etch chamber 209. In this embodiment, each bilayer 412 is a bilayer of a layer of silicon oxide 424 and a layer of silicon nitride 428.

After the stack 204 has been placed into the etch chamber 209, the stack 204 is cooled using a coolant with a coolant temperature below −20° C. (step 108). An etch gas comprising a metal containing component, a carbon containing component, and a halogen containing component is flowed into the etch chamber 209 (step 112). In this example, the etch gas is 5 to 75 sccm nitrogen trifluoride ($NF_3$), 40 to 300 sccm hydrogen ($H_2$), 4 to 20 sccm trifluoroiodomethane ($CF_3I$), 10-50 sccm fluoromethane ($CH_3F$), and 0.1 to 2.0 sccm tungsten hexafluoride ($WF_6$). In this example, a pressure of 5 to 60 mTorr is provided. The etch gas is formed into an etch plasma (step 116). This may be accomplished by providing an excitation RF with a frequency of 60 MHz at 200 to 8000 watts. The stack 204 is exposed to the etch plasma (step 120). A bias with a magnitude of at least about 400 volts is provided (step 124). In this embodiment, the bias is provided by providing an RF with a frequency of 400 kHz at 2 kW to 18 kW by the ESC source 248 to the ESC 208. The bias causes ions to be accelerated to the stack 204 causing the selective etching of high aspect ratio etch features into the plurality of bilayers 412 with respect to the carbon containing patterned mask 416 (step 128). The etch plasma is maintained for about 180 to 3600 seconds. The etch is able to etch both the silicon oxide 424 and silicon nitride 428 layers. After the etch is complete, other processes may be performed on the stack 204. The stack 204 is then removed from the etch chamber 209 (step 132).

Figure 4B:
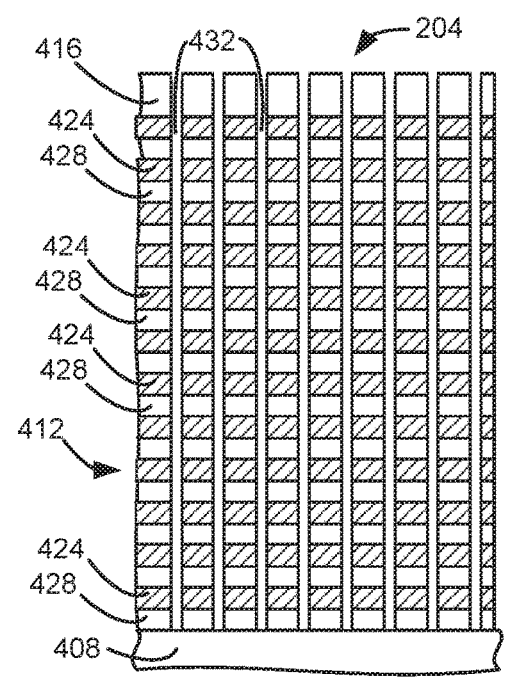

FIG. 4B is a cross-sectional view of the stack 204 after the contacts 432 have been etched. The contacts 432 are high aspect ratio contacts. Preferably, the high aspect ratio contacts 432 have a height to critical dimension (CD) width ratio of greater than 50:1, where in this embodiment, the CD is measured at the top of the feature. The etch process is able to selectively etch the silicon oxide 424 and silicon nitride layers 428 with respect to amorphous carbon with a selectivity of greater than 3:1, while etching high aspect ratio features. The resulting features also have reduced bowing, striation, distorting, capping, and tapering.

Previous processes that use an etch, where the stack is processed at a temperature above −20° C., relied on a fluorocarbon chemistry to etch and provide sidewall protection. Sidewall protection for previous processes was provided by polymer deposition, which was controlled by the concentration of carbon, where a higher concentration of carbon increases sidewall deposition, and by oxygen, where a higher concentration of oxygen consumes the deposited polymer. The higher concentration of oxygen also increased the consumption of the mask. Some previous processes used a silicon containing mask.

The above embodiment increases etch rate and improves contact shape/striation compared to a conventional approach. Without being bound by theory, it is proposed that an etchant with a metal containing component provides improved sidewall passivation, to prevent bowing. The halogen containing component facilitates the etching of the silicon oxide 424 and silicon nitride 428 layers. It has been unexpectedly found that the combination of providing $WF_6$ in the etch gas and the low temperature below −20° C. provides an improved passivation over the use of $WF_6$ and the low temperature separately. A primary benefit is to reduce the rate of bow growth, while incurring acceptable process tradeoffs, which may be used to produce a final result with less bowing and no tradeoffs.

In some embodiments, to provide a coolant 215 with a coolant temperature below −20° C. to the stack 204, the coolant is cooled to a coolant temperature below −60° C. In other embodiments, the coolant 215 is cooled to a coolant temperature between −30° C. to −200° C. In other embodiments, the coolant 215 is cooled to a coolant temperature between about −40° C. to about −200° C. In other embodiments, the coolant is cooled to a coolant temperature no more than about −50° C. In some embodiments, the stack 204 is cooled to a temperature between −30° C. to −200° C. Preferably, the flow rate of the metal containing component is between 0.01% to 5% of the total flow rate of the etch gas.

More preferably, the flow rate of the metal containing component is between 0.1% to 1% of the total flow rate of the etch gas.

In some embodiments, the etch gas further comprises one or more of a free fluorine providing component, a hydrogen containing component, a hydrocarbon containing component, a fluorocarbon containing component, and an iodine containing component. A free fluorine providing component is defined as a component that will normally break down in plasma to provide free-fluorine, such as $NF_3$ and sulfur hexafluoride ($SF_6$). Hydrogen containing components are preferably hydrogen ($H_2$), $CH_3F$ and difluoromethane ($CH_2F_2$). In addition, various components may form a single polyatomic molecule. For example, $CF_3I$ may provide both the fluorocarbon containing component and the iodine containing component. In addition, a hydrofluorocarbon-containing component may provide the hydrocarbon containing component and the fluorocarbon containing component. Iodine containing components may be selected from the group comprising at least one of trifluoroiodomethane ($CF_3I$), pentafluoroiodoethane ($C_2IF_5$), tetrafluorodiodoethane ($C_2I_2F_4$). Without being bound by theory, it is believed that the iodine from the iodine containing component provides an improved sidewall passivation, which helps to reduce bowing. By using a low substrate temperature in combination with certain reactants, a high quality protective film can be formed on sidewalls of the partially etched features during etching. The low temperature also enables some embodiments where the etch gas is oxygen free and free from both octafluorocyclobutane ($C_4F_8$), Hexafluoro-2-butyne ($C_4F_6$), and perfluoropropane ($C_3F_8$). In other embodiments, the etch gas further comprises $NF_3$, $H_2$, $CF_3I$, $CH_3F$, and $CH_2F_2$. In some of the embodiments, the etch gas further comprises at least one of $C_4F_8$, $C_4F_6$, $C_3F_8$, $SF_6$, tetrafluoromethane ($CF_4$), methane ($CH_4$), or fluoroform ($CHF_3$).

The ONON stack may be etched to form features, such as contact holes, lines, or trenches in making a 3D NAND memory device. Other embodiments may etch contact holes to be used in M0C and M0A, which are first metal contacts used to control 3D NAND junctions. Other embodiments may be used for dynamic random access memory (DRAM) capacitor etching. Other embodiments may be used to etch silicon oxide and polysilicon bilayers (OPOP) and cell etch DRAM, which may have a thick silicon oxide layers with embedded thin silicon nitride layers. Embodiments for ONON provide for a CD less than 70 nm with an etch depth of greater than 20 microns. Embodiments for DRAM provide a CD of less than 24 nm and a depth of greater than 2 microns. In other embodiments, the etch depth is greater than 3 microns. Such embodiments allow the etching of at least 48 bilayers of silicon oxide and silicon nitride in a single etch step using a single amorphous carbon mask with a thickness of more than 1 micron. In addition, the contacts preferably have a etch depth to neck aspect ratio of greater than 30:1.

In some embodiments, the stack may be a single layer of silicon oxide or silicon nitride. In other embodiments, the stack may be a single layer or multiple layers of other silicon containing materials.

The above embodiment used a bias with a magnitude of at least 400 volts. It has been found that a bias with a magnitude of at least 1000 volts would provide an improved etch. It is believed that a bias with a magnitude of at least 2000 volts would provide a further improved etch. Without being bound by theory, it is believed that the higher bias would allow for a higher aspect ratio etch, while taking advantage of other features, which allows for the use of an amorphous carbon mask and reducing striation and bowing.

In some embodiments, liquid nitrogen is used as a coolant that is flowed through the chuck or bottom electrode to provide cooling. In other embodiments, liquid Vertel Sinera™ manufactured by DuPont Corporation of Wilmington, Del. may be used as the coolant.

Figure 5:
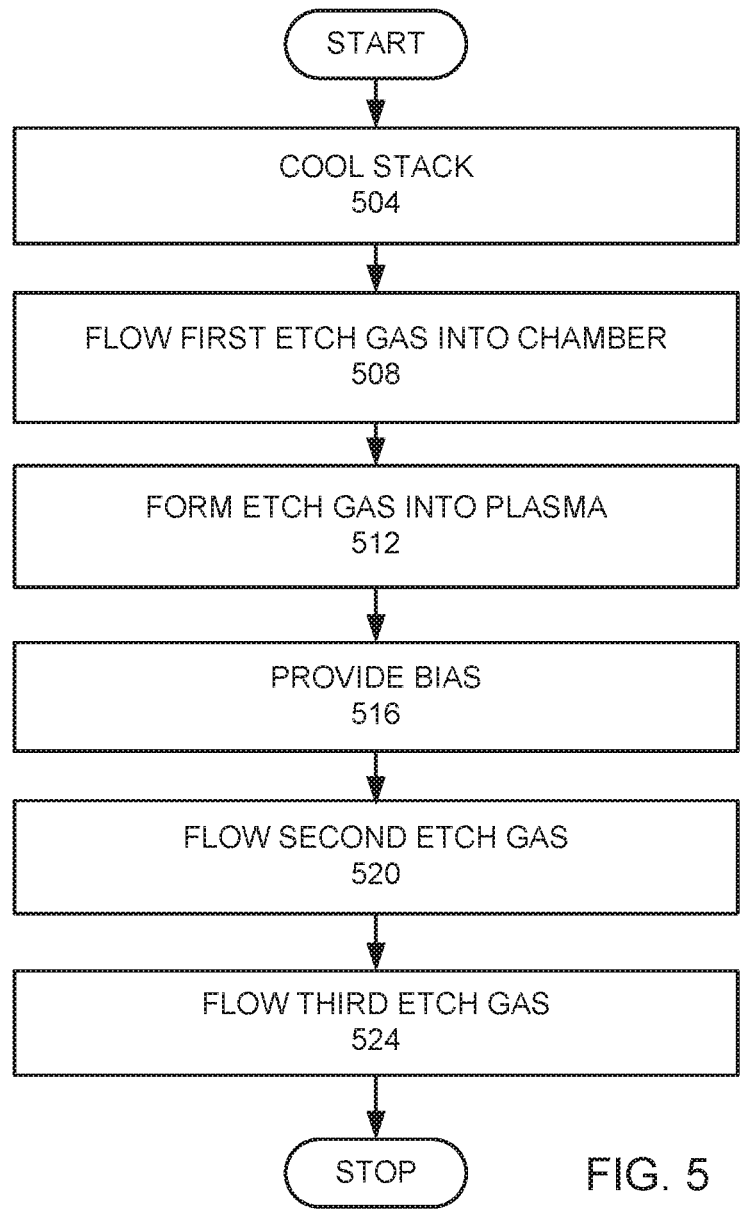
FIG. 5 is a flow chart of an embodiment using a multistep process.

In the above embodiment, a single continuous step may be used to etch the entire stack. FIG. 5 is a high level flow chart of another embodiment, which uses a multistep process. In this embodiment, a stack is cooled by a coolant 215 with a temperature below −20° C. (step 504). A first metal containing component free etch step flows a first etch gas into the etch chamber 209 (step 508). In this embodiment, the first etch gas comprises a carbon containing component and a halogen containing component, but does not contain a metal containing component. The first etch gas is formed into a plasma by providing RF power (step 512). A bias is also provided (step 516) to accelerate ions to the stack 204 to facilitate etching. After features are partially etched, a metal containing component etch step flows a second etch gas into the etch chamber 209 (step 520). The second etch gas may have an added component such as a metal containing component, where the first etch gas continues to flow. In the alternative, the flow of the first etch gas may be stopped and a second etch gas may be flowed, where the second etch gas comprises a metal containing component, a carbon containing component, and a halogen containing component at different flow rates than the flow rate of the components of the first etch gas. The second etch gas is used to further etch the features. A second metal containing component free etch step flows a third etch gas into the etch chamber 209 (step 524). The third etch gas in one example may only differ from the second etch gas by being metal containing component free. In the alternative, other components may also be changed to form the third etch gas, which is free of metal containing components.

Such a multistep process may have a first step that etches the features without the metal containing components. At the beginning of the etch, protection from bowing is not needed, so a metal containing component is not needed. In addition, the metal containing component may cause plugging with small feature sizes. The feature size increases during the etch, so introducing the metal containing component after the feature size is increased, reduces problems caused by plugging from the metal containing component. When the features are etched a certain distance and the danger of bowing increases, the metal containing component is added. Other changes in the recipe may also be made, which may be made to accommodate etching deeper features. After the features are etched deeper, bowing is less likely, which means that sidewall protection is either not needed or does not need to be as strong. As a result, the third etch gas does not need the metal containing component. The removal of the metal containing component may be used to avoid problems caused by the metal containing component, while etching deeper features. Other parameters may also be changed to facilitate etching deeper features. In other embodiments, other multiple steps may be used.

Figure 6:
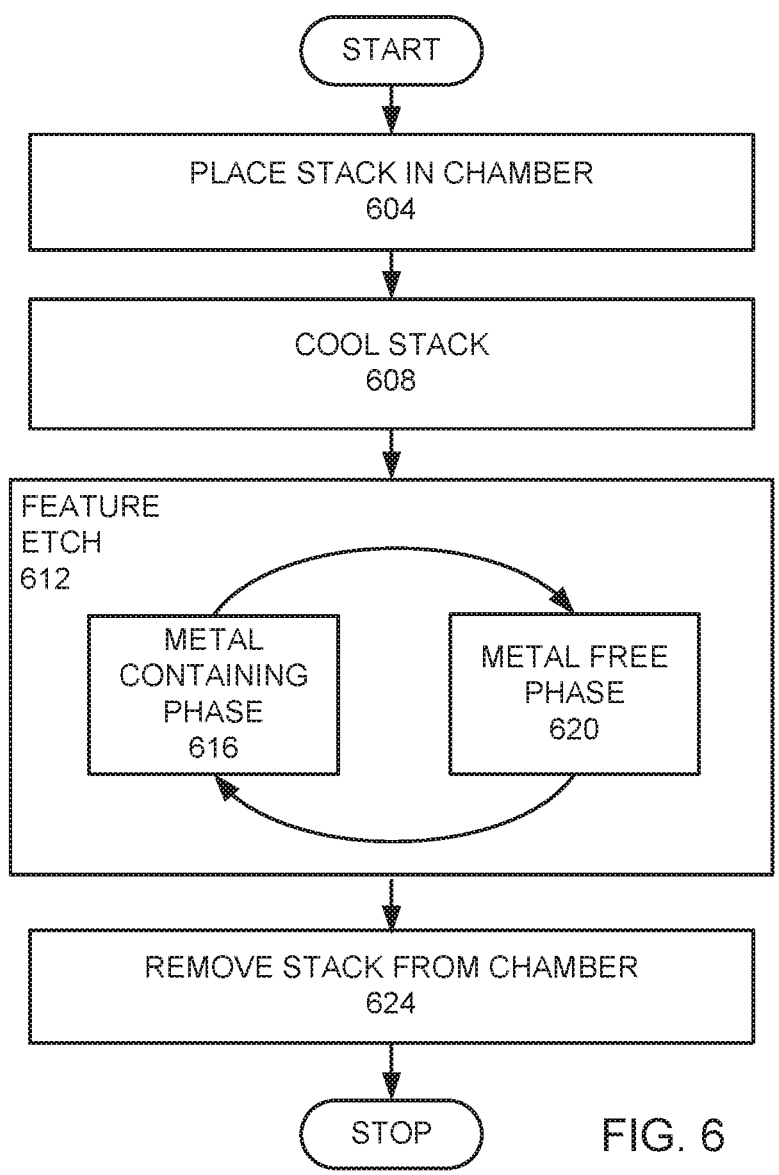
FIG. 6 is a flow chart of an embodiment using a cyclical process.

FIG. 6 is a flow chart of another embodiment, which uses a cyclical etch process. A stack 204 is placed in an etch chamber 209. The stack 204 is cooled using a coolant 215 at a temperature below −20° C. The features are etched (step 612) using a cyclical process with a plurality of cycles of a first etch phase with an etch gas comprising a metal containing component (step 616) and a second etch phase with an etch gas without a metal containing component (step 620). The second etch phase is therefore metal containing component free. In this example, the etch phases alternate and are not overlapping, so that the first etch phase with the etch gas comprising a metal containing component (step 616) is stopped before the second etch phase with the etch gas without a metal containing component (step 620). Likewise, during the cycles, the second etch phase is stopped before the first etch phase is initiated. When the etching of the features is completed, the stack is removed from the etch chamber (step 624). In other embodiments, the different etch phases may partially overlap.

The cyclical process provides additional tuning knobs, which provide additional tuning parameters, such as length of each phase and different gas recipes in order to optimize possibly competing goals, such as etch speed, bowing minimization, striation reduction, feature shape, and etch selectivity. Other cyclical processes may provide other process phases, using other process gases, instead of a metal containing component free etching phase. In an example, a cyclical process may have an etching phase and a passivation cleaning phase. The passivation cleaning phase uses a passivation cleaning gas that is metal containing component free to process the stack.

Bowing is normally a problem in the etching of contacts, where the features are cylindrical and may have a circular cross-section. Therefore, in various embodiments, the features are contacts with a circular cross-section. In other embodiments, the features may have other cross-sections, such as ovals, squares, and other polygons. By reducing bowing, the etched features have more of a cylindrical shape. In other embodiments, the features may be lines, steps, or other shapes. Other embodiments may have one or more of a silicon containing mask or a metal containing mask. Halogens in various embodiments are preferably fluorine, bromine, or iodine. In various embodiments, the metal containing component of the etch gas comprises a metal component selected from one or more of tungsten (W), tin (Sn), molybdenum (Mo), ruthenium (Ru), titanium (Ti), or tantalum (Ta). Examples of the metal containing component are at least one or more of $WF_6$, $TiCl_4$, $TiF_4$, $SnH_4$, $TaF_5$, $RuF_6$, and $SnCl_4$. In various embodiments, the carbon containing component may be selected from the group of hydrocarbons, fluorocarbons, hydrofluorocarbons, and bromofluorocarbons. Specifying that the etch gas further comprises a hydrocarbon means that at least one of the carbon containing components is also a hydrocarbon.

While this disclosure has been described in terms of several preferred embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure.

What is claimed is:

1. A method for etching features in a stack below a patterned mask in an etch chamber, comprising:
    a) cooling the stack with a coolant, with a coolant temperature below −20° C.;
    b) flowing an etch gas comprising a metal containing component, a carbon containing component, and a halogen containing component into the etch chamber;
    c) generating a plasma from the etch gas; and
    d) selectively etching features in the stack with respect to the patterned mask.

2. The method, as recited in claim 1, further comprising providing a bias with a magnitude of at least 400 volts.

3. The method, as recited in claim 1, wherein the coolant temperature is no more than about −50° C.

4. The method, as recited in claim 1, wherein the patterned mask is a carbon containing patterned mask.

5. The method, as recited in claim 1, wherein the stack is a stack formed from at least one of ONON, OPOP, or DRAM.

6. The method, as recited in claim 1, wherein the halogen containing component comprises a free fluorine providing component.

7. The method, as recited in claim 6, wherein the etch gas further comprises a hydrogen containing component, a hydrocarbon containing component, and a fluorocarbon containing component.

8. The method, as recited in claim 7, wherein the free fluorine providing component comprises $NF_3$ and the hydrogen containing component comprises $H_2$.

9. The method, as recited in claim 8, wherein the etch gas comprises a hydrofluorocarbon containing component which provides the hydrocarbon containing component and the fluorocarbon containing component.

10. The method, as recited in claim 1, wherein a flow rate of the metal containing component is between 0.1% to 1% of a flow rate of the etch gas.

11. The method, as recited in claim 1, wherein the etch gas further comprises $CF_3I$.

12. The method, as recited in claim 1, wherein the etch gas further comprises $CF_3I$, and wherein the etch gas comprises a hydrofluorocarbon containing component.

13. The method, as recited in claim 1, wherein the metal containing component comprises a metal component selected from at least one of tungsten (W), tin (Sn), molybdenum (Mo), ruthenium (Ru), titanium (Ti), or tantalum (Ta).

14. The method, as recited in claim 1, wherein the metal containing component comprises tungsten hexafluoride ($WF_6$).

15. The method, as recited in claim 1, further comprising a first metal containing component free etch step before steps b-d, wherein the first metal containing component free etch step comprises:
    flowing a first metal containing component free etch gas comprising a carbon containing component and a halogen containing component into the etch chamber;
    generating a plasma from the first metal containing component free etch gas;
    selectively etching features in the stack with respect to the patterned mask with the plasma from the first metal containing component free etch gas; and
    stopping the first metal containing component free etch gas.

16. The method, as recited in claim 15, further comprising a second metal containing component free etch step after step d, wherein the second metal containing component free etch step comprises:
    flowing a second metal containing component free etch gas comprising a carbon containing component and a halogen containing component into the etch chamber;
    generating a plasma from the second metal containing component free etch gas; and
    selectively etching features in the stack with respect to the patterned mask.

17. The method, as recited in claim 1, wherein steps a-d are a metal containing component etch phase of a cyclical etch process that comprises a plurality of cycles, wherein each cycle comprises:

the metal containing component etch phase comprising steps a-d, and stopping the metal containing component etch phase; and a metal containing component free etch phase comprising:
flowing a metal containing component free etch gas comprising a carbon containing component and a halogen containing component into the etch chamber;
generating a plasma from the metal containing component free etch gas;
selectively etching features in the stack with respect to the patterned mask with the plasma from the metal containing component free etch gas; and
stopping the metal containing component free etch phase.

18. The method, as recited in claim 1, wherein steps a-d are a metal containing component etch phase of a cyclical etch process that comprises a plurality of cycles, wherein each cycle comprises:

the metal containing component etch phase comprising steps a-d, and stopping the metal containing component etch phase; and a process phase comprising:
flowing a metal containing component free process gas into the etch chamber;
generating a plasma from the metal containing component free process gas;
processing the stack with the plasma from the metal containing component free process gas; and
stopping the process phase.

19. The method, as recited in claim 18, wherein the process phase is a passivation cleaning phase, and wherein the metal containing component free process gas comprises a passivation cleaning gas.

* * * * *